(12) United States Patent
Wang

(10) Patent No.: US 9,559,454 B2
(45) Date of Patent: Jan. 31, 2017

(54) USB MEMORY DEVICE

(71) Applicant: Yu-Ming Wang, Irvine, CA (US)

(72) Inventor: Yu-Ming Wang, Irvine, CA (US)

(73) Assignee: IDEM INC., Irvine, CA (US)

( * ) Notice: Subject to any disclaimer, the term of this patent is extended or adjusted under 35 U.S.C. 154(b) by 50 days.

(21) Appl. No.: 13/895,826

(22) Filed: May 16, 2013

(65) Prior Publication Data

US 2014/0340835 A1   Nov. 20, 2014

Related U.S. Application Data

(60) Provisional application No. 61/647,927, filed on May 16, 2012.

(51) Int. Cl.
| | |
|---|---|
| *G06F 1/18* | (2006.01) |
| *H01R 13/506* | (2006.01) |
| *H05K 5/02* | (2006.01) |
| *G06K 19/077* | (2006.01) |
| *H01R 13/66* | (2006.01) |

(52) U.S. Cl.
CPC .......... *H01R 13/506* (2013.01); *H05K 5/0278* (2013.01); *G06K 19/07732* (2013.01); *H01R 13/6658* (2013.01); *Y10T 29/49124* (2015.01)

(58) Field of Classification Search
CPC ................ H01R 13/506; H05K 5/0278; G06K 19/07732

USPC ...................................................... 361/679.32
See application file for complete search history.

(56) References Cited

U.S. PATENT DOCUMENTS

| | | | |
|---|---|---|---|
| 8,116,086 B2* | 2/2012 | Huang | 361/752 |
| 2010/0290181 A1* | 11/2010 | Huang | 361/679.32 |
| 2014/0098483 A1* | 4/2014 | Miller | 361/679.32 |

* cited by examiner

*Primary Examiner* — Ramon M Barrera
(74) *Attorney, Agent, or Firm* — Charles C. H. Wu; Charles C.H. Wu & Assoc., APC

(57) ABSTRACT

The present invention is a USB memory device comprising a chip-on-board (COB) package having a flash memory and a flash memory controller embedded within, a COB carrier for storing the COB package comprising a tray having a G-shaped block with a pair of side lock bumps, and a metal housing for inserting the COB carrier having a top surface, a bottom surface, a top rectangular cut out, a bottom rectangular cut out, a pair of ends, a pair of side cut outs, a pair of top rectangular openings and a pair of bottom rectangular openings. The COB package, the COB carrier and the metal housing are used to assemble the device by inserting the COB carrier from either of the pair of ends and sliding the COB carrier within the metal housing until the pair of side lock bumps interlocks with the pair of side cut outs.

15 Claims, 6 Drawing Sheets

USB MEMORY DEVICE

This application claims the benefit of U.S. Provisional Application No. 61/647,927 filed May 16, 2012.

BACKGROUND OF THE DISCLOSURE

Technical Field of the Invention

The present embodiment relates in general to universal serial bus (USB) memory devices. More specifically, the present embodiment relates to a system and method for assembling a USB memory device having a chip on board (COB) carrier and a metal housing.

Description of the Related Art

USB memory devices are typically used for storage, back-up and transfer of computer files. Such devices are rewritable and can be removably connected to computers for accessing data. USB devices generally include a chip on board (COB) memory card for storing data and housing for covering the COB memory card. Several types of USB memory devices are well-known in the art. Such COB memory cards are difficult to be secured to the casing. Such devices are also difficult to be disassembled for repair and service. In addition, the casing can be moved only in single direction, and the casing required for covering the COB memory cards is costly.

Conventional USB memory devices have other drawbacks. For instance, an existing device includes a Universal Serial Bus (USB) memory card having a tube metal housing and a COB Universal Serial Bus (USB) device and a carrier substrate with U-block disposed on one side and vertically extending upward from a bottom surface of the U-block. The COB-USB device positioned on the carrier substrate forms a USB card sub-assembly that is securely located inside the metal housing with the U-block serving to stop the COB-USB device from slipping out of the metal housing. A major drawback of the USB memory card is that the card cannot be easily assembled by the manufacturer.

A variant to this device uses a flash memory device that includes a circuit board and a contact module slidable with respect to the circuit board. The circuit board includes a plurality of first contacts each having a stiff first contact portion. The contact module includes a slider and a plurality of second contacts fixed to the slider. The slider is slidable with respect to the circuit board along a front-to-rear direction between a first position and a second position. However, the device cannot be easily disassembled for repair and service without the risk of damage.

Another existing device provides a portable USB flash memory device that includes a COB printed circuit board assembly inside. The flash memory device is enclosed inside a housing structure with a sliding button to deploy the USB plug connector external to the housing structure. The flash memory device is able to connect to a host with a Universal Serial Bus USB interface. The downside to this device is that the COB printed circuit board is secured to the housing structure via an opening on the housing structure and hence can be inserted only in a single direction.

Therefore it can be seen that there is a need for an improved USB memory device having a COB carrier, a COB memory card and a metal housing that can be easily assembled and disassembled. Such a device would include an external enclosure that can be pre-assembled with the metal housing to enable flexibility to install the COB carrier only when required. This needed device would include a side interlock mechanism to prevent unauthorized retrieval of the COB carrier from the metal housing. Such a device would be easily assembled by inserting COB carrier from either direction. Further, the COB carrier would be easily removed from the metal housing without damaging either the metal housing or the carrier for easy repair and service. This device would be simple, secure and cost effective.

SUMMARY OF THE EMBODIMENT

The present invention is a USB memory device comprising a chip-on-board (COB) package having a flash memory and a flash memory controller embedded within, a COB carrier for storing the COB package having a tray with a G-shaped block including a pair of side lock bumps, and a metal housing for inserting the COB carrier having a top surface, a bottom surface, a top rectangular cut out, a bottom rectangular cut out, a pair of ends, a pair of side cut outs, a pair of top rectangular openings and a pair of bottom rectangular openings. The pair of side lock bumps is designed to interlock with the pair of side cutouts to secure the COB carrier within the metal housing. The COB carrier can be inserted into the metal housing from either of the pair of ends. The USB memory device is assembled by sliding the COB carrier within the metal housing until the pair of side lock bumps interlocks with the pair of side cut outs.

A method for assembling the USB memory device is initiated by inserting the COB package into the COB carrier. Next, the COB carrier is inserted into the metal housing through at least one of pair of ends of the metal housing. Finally, the COB carrier along with the COB package is slid within the metal housing until the pair of side lock bumps interlocks with the pair of side cut outs of the metal housing to assemble the USB memory device. The pair of side lock bumps thus enables easy and flexible assembly of the USB memory device.

One objective of the present invention is to provide a USB memory device having a metal housing and a COB carrier that can be easily assembled from two directions.

A second objective of the present invention is to provide a USB memory device having enhanced locking mechanism to prevent unauthorized retrieval of the COB carrier.

A third objective of the present invention is to provide a pair of side lock bumps to enable flexible assembly and disassembly of the device.

Another objective of the present invention is to provide a USB memory device that can be disassembled without damage.

Yet another objective of the present invention is to provide a cost-effective USB memory device.

Still another objective of the present invention is to provide a secure memory device.

These and other advantages and features of the present invention are described with specificity so as to make the present invention understandable to one of ordinary skill in the art.

DETAILED DESCRIPTION OF THE DRAWINGS

In the following discussion that addresses a number of embodiments and applications of the present invention, reference is made to the accompanying drawings that form a part hereof, and in which is shown by way of illustration specific embodiments in which the invention may be practiced. It is to be understood that other embodiments may be utilized and changes may be made without departing from the scope of the present invention.

Various inventive features are described below that can each be used independently of one another or in combination with other features. However, any single inventive feature may not address any of the problems discussed above or only address one of the problems discussed above. Further, one or more of the problems discussed above may not be fully addressed by any of the features described below.

Figure 1:
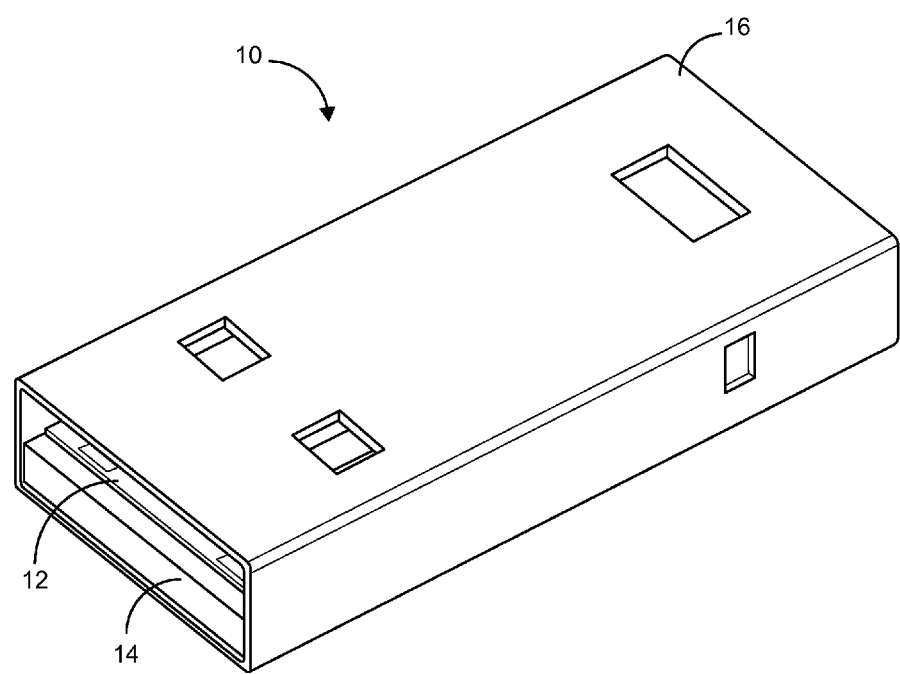
FIG. 1 illustrates a perspective view of a universal serial bus (USB) memory device of the present invention.

Referring to FIG. 1, a perspective view of a universal serial bus (USB) memory device 10 of the present invention is illustrated. The USB memory device 10 comprises a chip-on-board (COB) package 12 having a flash memory and a flash memory controller embedded within, a COB carrier 14 for storing the COB package 12, and a metal housing 16 for inserting the COB carrier 14. The COB package 12, the COB carrier 14 and the metal housing 16 are used to assemble the USB memory device 10 in a secure manner.

Figure 2:
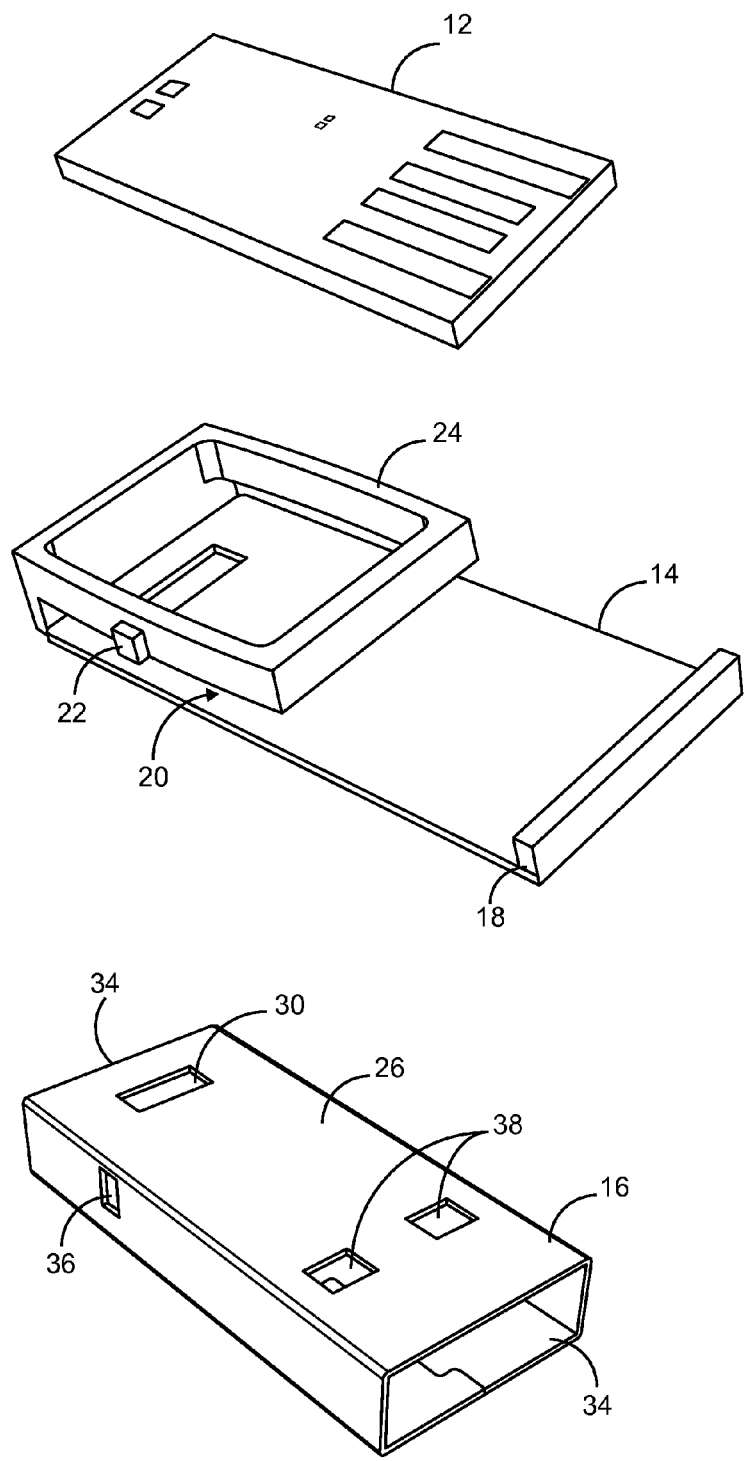
FIG. 2 illustrates an exploded view of the USB memory device of the present invention.

FIG. 2 illustrates an exploded view of the USB memory device 10 of the present invention. In this figure, the COB package 12, the COB carrier 14 and the metal housing 16 are shown separately. The chip-on-board (COB) package 12 includes the flash memory and flash memory controller embedded within. The flash memory can be varied between 4 GB and 128 GB. The COB carrier 14 includes a tray 18 having a G-shaped block 20 with a pair of side lock bumps 22. The pair of side lock bumps 22 is positioned on a top cover 24 of the G-shaped block 20 to enable easy and flexible assembly of the USB memory device 10. The metal housing 16 includes a top surface 26, a bottom surface 28, a top rectangular cut out 30, a bottom rectangular cut out 32, a pair of ends 34, a pair of side cut outs 36, a pair of top rectangular openings 38 and a pair of bottom rectangular openings 40. The pair of side lock bumps 22 is designed to interlock with the pair of side cutouts 36 to secure the COB carrier 14 within the metal housing 16. The COB carrier 14 can be inserted into the metal housing 16 from either of the pair of ends 34. The USB memory device 10 is assembled by sliding the COB carrier 14 within the metal housing 16 until the pair of side lock bumps 22 interlocks with the pair of side cut outs 36.

Figure 3A:
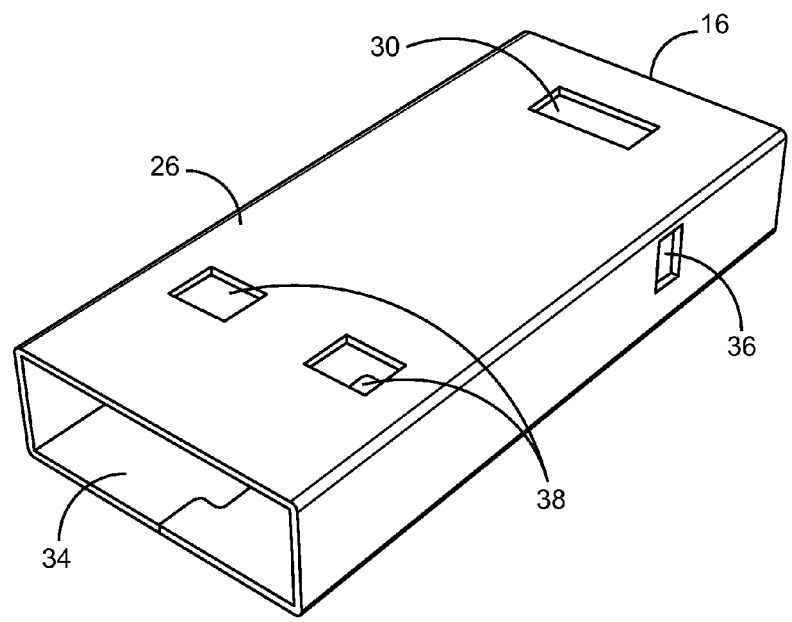
FIGS. 3A-3B illustrate top and bottom perspective views of the present invention, showing a metal housing.
Figure 3B:
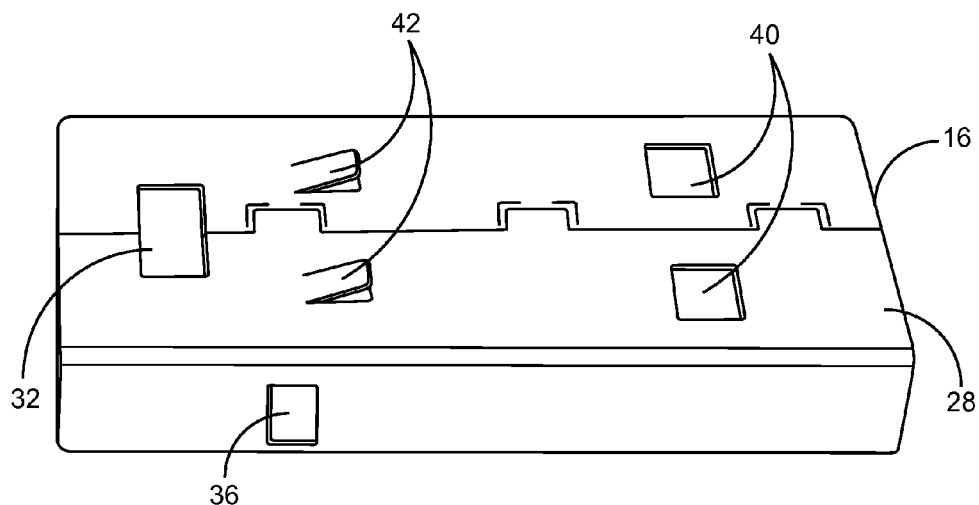

FIGS. 3A-3B illustrate top and bottom perspective views of the present invention, showing the metal housing 16. The metal housing 16 is rectangular in shape and comprises a pair of teeth 42 on the bottom surface 28 configured to interlock the metal housing 16 with an external enclosure. The pair of bottom rectangular openings 40 is also positioned on the bottom surface 28. The top rectangular cutout 30 is positioned on the top surface 26 of the metal housing 16 and the bottom rectangular cutout 32 is positioned on the bottom surface 28 of the metal housing 16. The top rectangular cutout 30 and the bottom rectangular cut out 32 are configured to interlock the metal housing 16 with an interlocking bump of an external enclosure. The metal housing 16 may be pre-assembled with the external enclosure to enable flexibility in installing the COB carrier 14 locally only when needed.

Figure 4A:
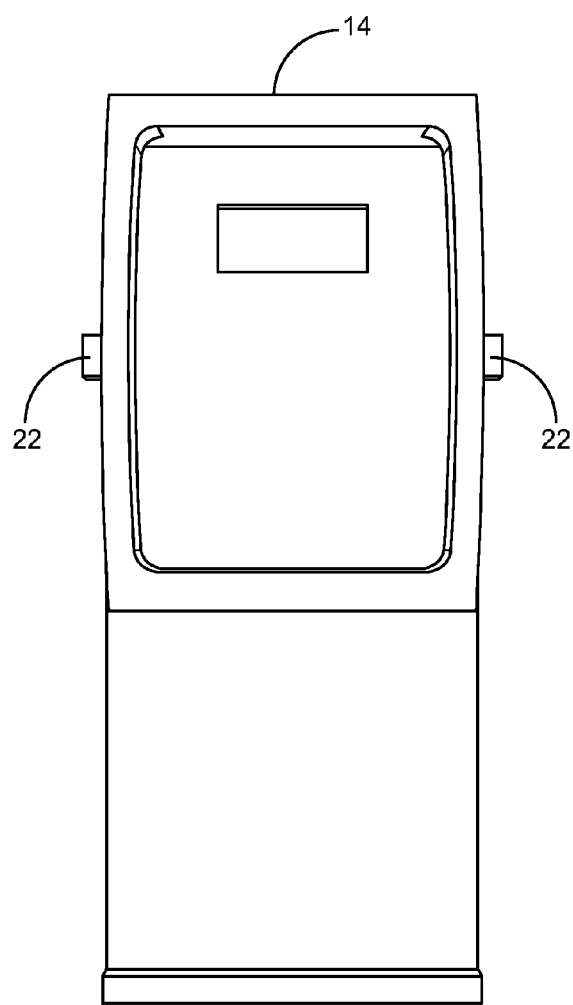
FIGS. 4A-4B illustrate top and side views of the present invention, showing a chip on board (COB) carrier.
Figure 4B:
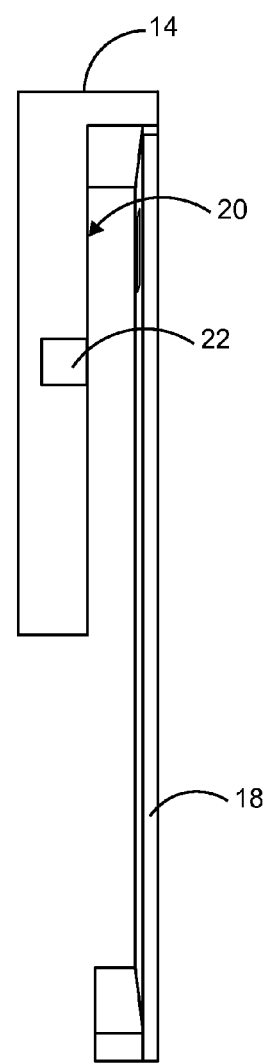

FIGS. 4A-4B illustrate top and side views of the present invention, showing the COB carrier 14. The COB carrier 14 can be inserted into the metal housing 16 from either of the pair of ends 34. The G-shaped block 20 provides better elastic retention property to the COB carrier 14. The top cover 24 of the G-shaped block 20 may be in any desired shape selected from a group consisting of: hallow rectangular, V, U and S. The pair of side lock bumps 22 is designed to interlock with the pair of side cutouts 36 to secure the COB carrier 14 within the metal housing 16 so as to enable easy and flexible assembly of the device 10. The pair of side lock bumps 22 also helps to easily disassemble the device 10 without damaging the metal housing 16 and the COB carrier 14. The COB package 12 can be easily taken out of the metal housing 16 or the COB carrier 14 using common tweezers. Further, the pair of side lock bumps 22 prevents unauthorized retrieval of the COB carrier 14 from the metal housing 16. The COB carrier 14 is made of plastic and has elastic retention property. The elastic retention property and the pair of side lock bumps 22 helps to interlock the COB carrier 14 with the pair of side cut outs 36 of the metal housing 16.

Figure 5A:
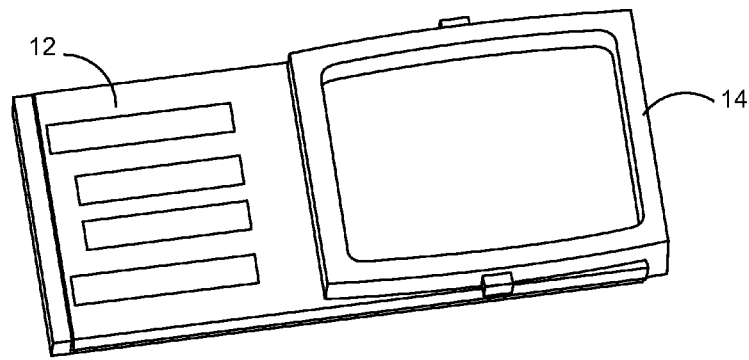
FIGS. 5A-5C illustrate a method for assembling the USB memory device of the present invention.
Figure 5B:
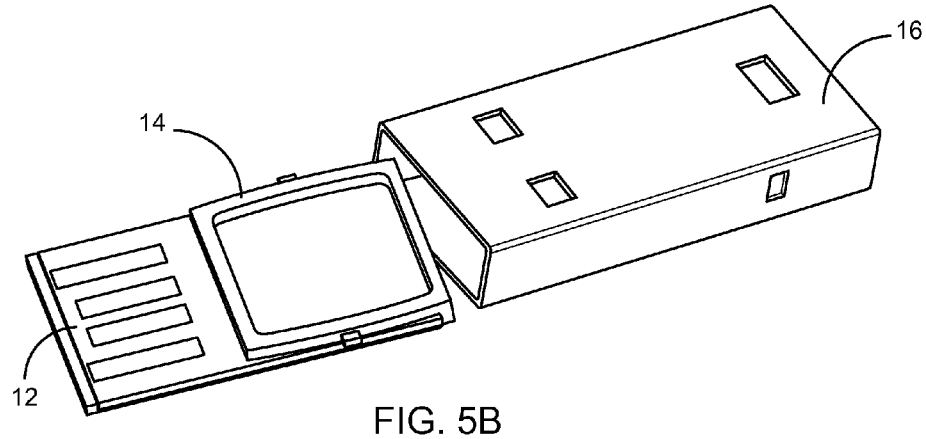
Figure 5C:
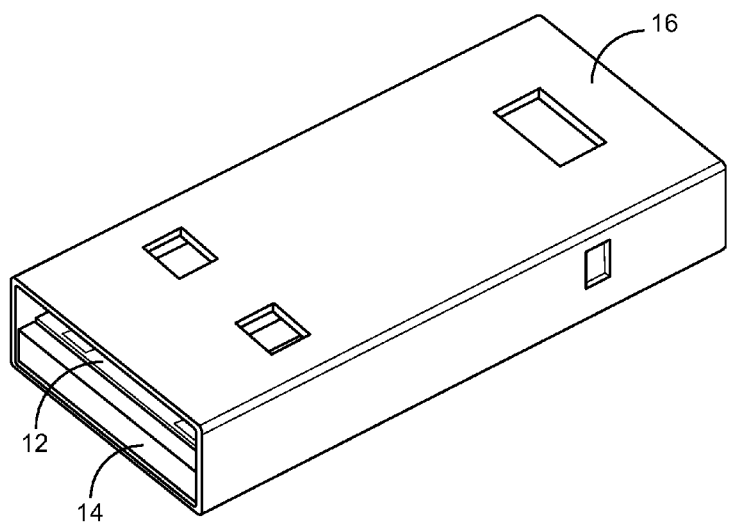

Turning to FIGS. 5A-5C, a method for assembling the USB memory device 10 of the present invention is illustrated. As shown in FIG. 5A, the COB package 12 is first inserted into the COB carrier 14. Next, as shown in FIG. 5B, the COB carrier 14 is inserted into the metal housing 16 through at least one of pair of ends 34 of the metal housing 16. Finally, as shown in FIG. 5B, the COB carrier 14 along with the COB package 12 is slid within the metal housing 16 until the pair of side lock bumps 22 interlocks with the pair of side cut outs 36 of the metal housing 16 to assemble the USB memory device 10. The pair of side lock bumps 22 thus enables easy and flexible assembly of the USB memory device 10 through both directions.

Figure 6A:
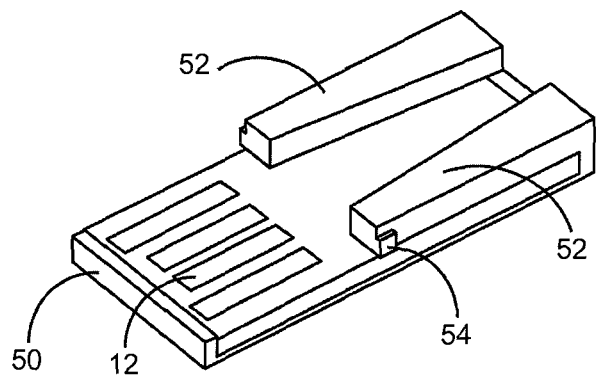
FIGS. 6A-6B illustrate a method for assembling the USB memory device of the present invention, showing an alternate embodiment of the COB carrier.
Figure 6B:
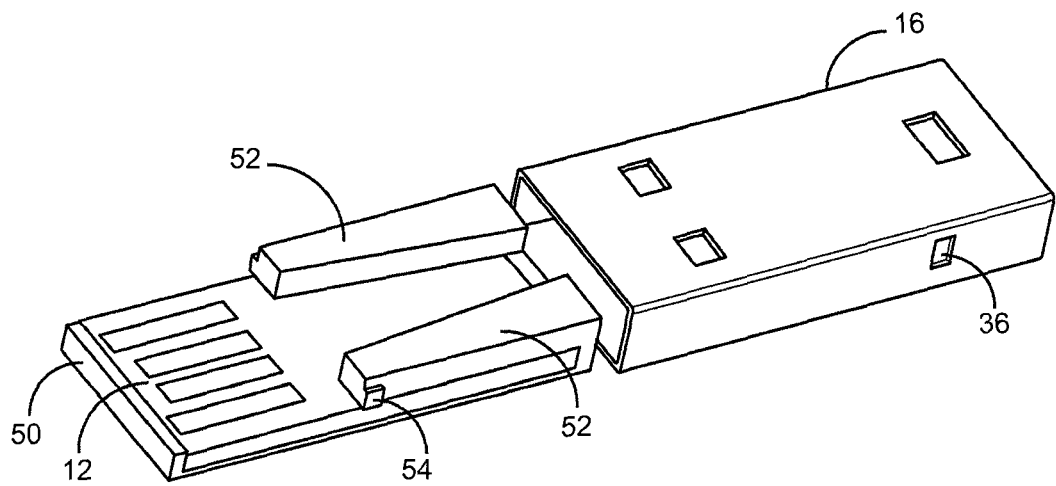
Figure 6C:
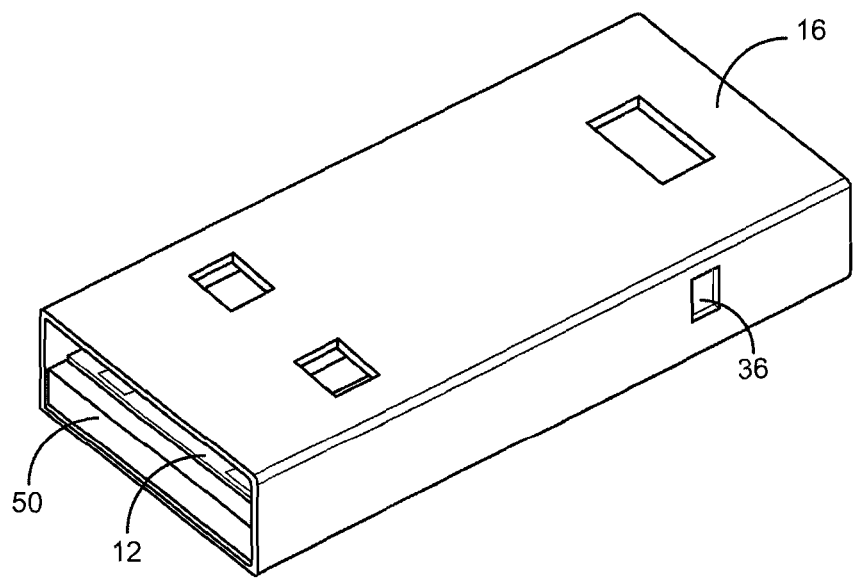

FIGS. 6A-6B illustrate a method for assembling the USB memory device 10 of the present invention, showing an alternate embodiment of the COB carrier 50. The COB package 12 inserted into the alternate embodiment of the COB carrier 50 is shown in FIG. 6A. In this embodiment, the top cover 52 of the COB carrier 50 is V-shaped. The top cover 52 can be in any desired shape selected from a group consisting of: hallow rectangular, V, U and S. As shown in FIG. 6B, the COB carrier 14 is then inserted into the metal housing 16. Finally, as shown in FIG. 6C, the COB carrier 14 along with the COB package 12 is slid within the metal housing 16 until the pair of side lock bumps 54 interlocks with the pair of side cut outs 36 of the metal housing 16 to assemble the USB memory device 10.

The enhanced locking mechanism formed by the pair of side cutouts 36 and the pair of side lock bumps 22 ensures product integrity and security to the USB memory device 10. The COB package 12, the COB carrier 14 and the metal housing 16 can also be used to assemble the USB connector. The device 10 can be easily assembled and disassembled from either of the pair of ends 34 of the metal housing 16. This offers flexibility to install the COB carrier 14 either before or after the metal housing 16 is assembled in the external enclosure. When repair or service is needed, the device 10 can be disassembled without damaging either the metal housing 16 or the COB carrier 14. In addition, the pair of side lock bumps 22 prevents unauthorized retrieval of the COB carrier 14 from the metal housing 16 without breaking the external enclosure. The above discussed method provides an easy-to assemble, cost-effective, secure and portable USB memory device 10 to the user.

The foregoing description of the preferred embodiment of the present invention has been presented for the purpose of illustration and description. It is not intended to be exhaustive or to limit the invention to the precise form disclosed. Many modifications and variations are possible in light of the above teachings. For example, the metal housing 16 may be available with or without an external enclosure. In addition, the flash memory of the COB package 12 may be varied depending on the needs of the user. It is intended that the scope of the present invention not be limited by this detailed description, but by the claims and the equivalents to the claims appended hereto.

What is claimed is:

1. A universal serial bus (USB) memory device comprising:
    a chip-on-board (COB) package having a flash memory and a flash memory controller embedded within;
    a COB carrier for storing the COB package, the COB carrier includes a tray having a G-shaped block with a pair of side lock bumps; and
    a metal housing for inserting the COB carrier, the metal housing includes a top surface, a bottom surface, a top rectangular cut out, a bottom rectangular cut out, a pair of ends, a pair of side cut outs, a pair of top rectangular openings and a pair of bottom rectangular openings;
    whereby the pair of side lock bumps is designed to interlock with the pair of side cutouts to secure the COB carrier within the metal housing so as to assemble the USB memory device in a secure manner.

2. The device of claim 1 wherein the pair of side lock bumps are positioned on a top cover of the G-shaped block.

3. The device of claim 1 wherein the COB carrier can be inserted into the metal housing from either of the pair of ends.

4. The device of claim 1 wherein the bottom surface of the metal housing comprises a pair of teeth configured to interlock the metal housing with an external enclosure.

5. The device of claim 1 wherein the top rectangular cutout is positioned on the top surface of the metal housing.

6. The device of claim 1 wherein the bottom rectangular cutout is positioned on the bottom surface of the metal housing.

7. The device of claim 1 wherein the top rectangular cutout and the bottom rectangular cut out are configured to interlock the metal housing with an interlocking bump of an external enclosure.

8. The device of claim 1 wherein the G-shaped block provides better elastic retention property to the COB carrier.

9. The device of claim 1 wherein the pair of side lock bumps enable easy and flexible assembly of the USB memory device.

10. The device of claim 1 wherein the pair of side lock bumps prevent unauthorized retrieval of the COB carrier from the metal housing.

11. The device of claim 1 wherein the metal housing is rectangular in shape.

12. The device of claim 1 wherein the top cover of the G-shaped block may be in any desired shape selected from a group consisting of: hallow rectangular, V, U and S.

13. The device of claim 1 wherein the device can be easily disassembled without damaging the metal housing and the COB carrier.

14. The device of claim 1 wherein the COB carrier is made of plastic.

15. The device of claim 1 wherein USB memory device is portable.

* * * * *